United States Patent
Socha et al.

(10) Patent No.: US 7,594,199 B2
(45) Date of Patent: Sep. 22, 2009

(54) METHOD OF OPTICAL PROXIMITY CORRECTION DESIGN FOR CONTACT HOLE MASK

(75) Inventors: Robert John Socha, Campbell, CA (US); Xuelong Shi, San Jose, CA (US); Douglas Van Den Broeke, Sunnyvale, CA (US); Jang Fung Chen, Cupertino, CA (US)

(73) Assignee: ASML Masktools B.V. (NL)

(*) Notice: Subject to any disclaimer, the term of this patent is extended or adjusted under 35 U.S.C. 154(b) by 617 days.

(21) Appl. No.: 10/756,829

(22) Filed: Jan. 14, 2004

(65) Prior Publication Data

US 2004/0229133 A1    Nov. 18, 2004

Related U.S. Application Data

(60) Provisional application No. 60/439,808, filed on Jan. 14, 2003, provisional application No. 60/530,656, filed on Dec. 19, 2003.

(51) Int. Cl.
*G06F 17/50* (2006.01)
(52) U.S. Cl. .............................. 716/2; 716/21
(58) Field of Classification Search .............. 716/5, 716/19, 21, 2
See application file for complete search history.

(56) References Cited

U.S. PATENT DOCUMENTS

| | | | |
|---|---|---|---|
| 5,229,230 | A | 7/1993 | Kamon |
| 5,242,770 | A | 9/1993 | Chen et al. |
| 5,446,521 | A | 8/1995 | Hainsey et al. |
| 5,532,090 | A | 7/1996 | Borodovsky |
| 5,595,843 | A | 1/1997 | Dao |
| 5,620,816 | A | 4/1997 | Dao |
| 5,680,588 | A | 10/1997 | Gortych et al. |
| 5,682,323 | A | 10/1997 | Pasch et al. |
| 5,707,765 | A | 1/1998 | Chen |

(Continued)

FOREIGN PATENT DOCUMENTS

EP    1 202 119 A1    5/2002

(Continued)

OTHER PUBLICATIONS

Kenny K.H. Toh, et al., "Design Methodology for Dark-Field Phase-Shifted Masks," SPIE vol. 1463 Optical/Laser Microlithography IV (1991), p. 402-413.

(Continued)

*Primary Examiner*—Jack Chiang
*Assistant Examiner*—Suresh Memula
(74) *Attorney, Agent, or Firm*—Pillsbury Winthrop Shaw Pittman LLP

(57) ABSTRACT

Disclosed concepts include a method of optimizing an illumination profile of a pattern to be formed in a surface of a substrate. Illumination is optimized by defining a transmission cross coefficient ("TCC") function determined in accordance with an illumination pupil and a projection pupil corresponding to an illuminator, representing at least one resolvable feature of a mask to be printed on the substrate by at least one impulse function, and creating an interference map of a predetermined order based on the at least one impulse function and the TCC function, wherein the interference map represents the at least one resolvable feature to be printed on the substrate and areas of destructive interference.

13 Claims, 11 Drawing Sheets

U.S. PATENT DOCUMENTS

| | | | |
|---|---|---|---|
| 5,895,741 | A | 4/1999 | Hasegawa et al. |
| 5,969,441 | A | 10/1999 | Loopstra et al. |
| 6,046,792 | A | 4/2000 | Van Der Werf et al. |
| 6,214,497 | B1 | 4/2001 | Stanton |
| 6,223,139 | B1 | 4/2001 | Wong et al. |
| 6,263,299 | B1* | 7/2001 | Aleshin et al. ............... 703/5 |
| 6,303,253 | B1 | 10/2001 | Lu |
| 6,355,382 | B1 | 3/2002 | Yasuzato et al. |
| 6,413,684 | B1 | 7/2002 | Stanton |
| 6,519,760 | B2 | 2/2003 | Shi et al. |
| 6,563,566 | B2 | 5/2003 | Rosenbluth et al. |
| 6,777,141 | B2 | 8/2004 | Pierrat |
| 6,787,271 | B2 | 9/2004 | Cote et al. |
| 6,792,591 | B2 | 9/2004 | Shi et al. |
| 6,807,662 | B2 | 10/2004 | Toublan et al. |
| 2002/0045106 | A1 | 4/2002 | Baselmans et al. |
| 2002/0062206 | A1* | 5/2002 | Liebchen ............... 703/6 |
| 2002/0083410 | A1 | 6/2002 | Wu et al. |
| 2002/0152452 | A1 | 10/2002 | Socha |
| 2002/0157081 | A1 | 10/2002 | Shi et al. |
| 2002/0192578 | A1* | 12/2002 | Tanaka et al. ............... 430/30 |
| 2003/0103189 | A1* | 6/2003 | Neureuther et al. ......... 351/176 |
| 2003/0140330 | A1* | 7/2003 | Tanaka et al. ............... 716/19 |
| 2003/0228541 | A1 | 12/2003 | Hsu et al. |
| 2004/0122636 | A1 | 6/2004 | Adam |

FOREIGN PATENT DOCUMENTS

| | | |
|---|---|---|
| EP | 1 237 046 A2 | 9/2002 |
| WO | WO 98/40791 | 9/1998 |
| WO | WO 02/03140 A1 | 1/2002 |
| WO | WO 03/054626 A1 | 7/2003 |

OTHER PUBLICATIONS

Richard Schenker, et al., "*Alternating Phase Shift Masks for Contact Patterning*," Proceedings of SPIE vol. 5040 Optical Microlithography XVI (2003), p. 294-302.

XP-000989124—Michael S. Yeung et al.; *Optical/Laser Microlithography VI*; Extension of the Hopkins Theory of Partially Coherent Imaging to Include Thin-film Interference Effects; c. 1993; pp. 452-463; SPIE vol. 1927.

XP-002276634—Olivier Toublan et al.; *Optical/Laser Microlithography XIV*; Fully Automatic Side Lobe Detection and Correction Technique for Attenuated Phase Shift Masks; c. 2000; pp. 1541-1547; SPIE vol. 4346.

XP-001187568—J. A. Torret et al.; *Optical/Laser Microlithography XV*; Contrast-Based Assist Feature Optimization; c. 2002; pp. 179-187; SPIE vol. 4691.

XP-000869997—J. Fung Chen et al.; Practical I-Line OPC Contact Masks for Sub-0.3Micron Design Rule Application: Part I-OPC Design Optimization; c. 1997; pp. 181-201.

Christoph Dolainsky, et al., "Simulation based method for sidelobe suppression," Optical Microlithography XIII, Proceedings of SPIE, 2000, pp. 1156-1162, vol. 4000.

Nicolas Bailey Cobb, "Fast Optical and Process Proximity Correction Algorithms for Integrated Circuit Manufacturing," Ph.D. dissertation, Spring 1998, pp. 35-72, University of California at Berkeley.

J.A. Torres, et al., "Contrast-Based Assist Feature Optimization," Optical Microlithography XV, 2002, pp. 179-187, Proceedings of SPIE, vol. 4691, SPIE.

Olivier Toublan, et al., "Fully Automatic Side Lobe Detection and Correction Technique for Attenuated Phase Shift Masks," Optical Microlithography XIV, 2001, pp. 1541-1547, Proccedings of SPIE, vol. 4346, SPIE.

Michael S. Yeung, "Extension of the Hopkins theory of partially coherent Imaging to Include thin-film interference effects," Optical/Laser Microlithography VI, 1993, pp. 452-463, SPIE, vol. 1927.

Douglas Van Den Broeke, et al., "Near 0.3 $k_1$ Full Pitch Range Contact Hole Patterning Using Chromeless Phase Lithography (CPL)," Proceedings of the SPIE, Sep. 9, 2003, pp. 297-308, vol. 5256, SPIE.

Kyoji Nakajo, et al., "Auxlllary pattern generation to cancel unexpected Images at sidelobe overlap regions in attenuated phase-shift masks," SPIE vol. 3748, Sep. 1999, pp. 214-221.

J. Fung Chen, et al., "Practical I-Line OPC Contact Masks for Sub-0.3Micron Design Rule Application: Part 1—OPC Design Optimization," pp. 181-201, 1997.

* cited by examiner

METHOD OF OPTICAL PROXIMITY CORRECTION DESIGN FOR CONTACT HOLE MASK

The present invention claims priority from U.S. provisional patent application No. 60/439,808 filed Jan. 14, 2003 entitled "A Method of Optical Proximity Correction Design & Optimization for Deep Sub-Wavelength Contact Hole Mask," and from U.S. provisional patent application No. 60/530,656 filed on Dec. 19, 2003, entitled "Extending Interference Mapping to Improve the Depth of Focus and Exposure Latitude."

FIELD OF THE INVENTION

The field of the invention relates generally to a method and program product for microlithography for optimizing an illumination profile of a pattern to be formed in a surface of a substrate.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book *Microchip Fabrication: A Practical Guide to Semiconductor Processing*, Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

"Assist features" in masks may be used to improve the image projected onto the resist and ultimately the developed device. Assist features are features that are not intended to appear in the pattern developed in the resist but are provided in the mask to take advantage of diffraction effects so that the developed image more closely resembles the desired circuit pattern. Assist features are generally "sub-resolution" or "deep sub-resolution" meaning that they are smaller in at least one dimension than the smallest feature in the mask that will actually be resolved on the wafer. Assist features may have dimensions defined as fractions of the critical dimension. In other words, because the mask pattern is generally projected with a magnification of less than 1, e.g. ¼ or ⅕, the assist feature on the mask may have a physical dimension larger than the smallest feature on the wafer.

At least two types of assist features may be used. Scattering bars are lines with a sub-resolution width placed on one or both sides of an isolated conductor to mimic proximity effects that occur in densely packed regions of a pattern. Serifs are additional areas of various shapes placed at the corners and ends of conductor lines, or the corners of rectangular features, to make the end of the line, or the corner, more nearly square or round, as desired (note in this context that assist features commonly referred to as "hammerheads" are regarded as being a form of serif). Further information on the use of scattering bars and serifs can be found in U.S. Pat. Nos. 5,242,770 and 5,707,765, for example, which are incorporated herein by reference.

Of course, one of the goals in integrated circuit fabrication is to faithfully reproduce the original circuit design on the wafer (via the mask) which is improved with the use of assist features. Placement of these assist features generally follow a pre-defined set of rules. Following this method, designers determine how to bias a line, for example, and placement of assist features is determined in accordance with a set of predetermined rules. When creating the set of rules, test masks are exposed to different illumination settings and NA setting, which is repeated. Based on the set of test masks, a set of rules are created for assist feature placement. FIG. 11 illustrates a mask 110 including resolvable features 112 to be formed on a substrate and assist features 114 placed in accordance with a predefined set of rules in a mask.

There has yet to be created optimization and model methods for determining the most optimal locations of assist features in a mask. Thus, there exists a need for a method of strategically and optimally placing assist features.

SUMMARY

The disclosed concepts include a method of optimizing an illumination profile of a pattern to be formed in a surface of a substrate. Using this method, a transmission cross coefficient ("TCC") function is determined and is based on an illumination pupil and a projection lens pupil. Also, at least one resolvable feature of a mask to be printed on the substrate may be represented by at least one impulse function. Based on both the impulse function and the TCC function, an interference map of a predetermined order may be generated and represents the at least one resolvable feature to be printed on the substrate. Moreover, assist features may be optimally positioned in the mask corresponding to an area of the interference map having an intensity of a predetermined level. For a bright field mask, this intensity typically represents a light intensity that causes destructive interference, or a magnitude in change of intensity that would likewise cause destructive interference. For a dark field mask, this intensity typically represents a light intensity that causes constructive interference, or a magnitude in change of intensity that would likewise cause constructive interference.

Yet another disclosed concept includes a method of optimizing an illumination profile of a pattern of resolvable features to be formed in a surface of a substrate. The method includes creating a Cartesian coordinate interference map having at least two axes. The map is created in accordance with an impulse function representing the pattern of resolvable features to be formed in the substrate and a transmission cross coefficient function. The interference map represents the pattern of resolvable features to be formed in the substrate and at least one area of interference. This area of interference is angled with respect to at least two axes that have an origin corresponding to the center of the pattern to be formed and that are parallel with respect to the corresponding axes of the interference map. Based on this map, assist feature may be placed in an area of the mask corresponding to the area of interference.

The foregoing and other features, aspects, and advantages of the present invention will become more apparent from the following detailed description of the present invention when taken in conjunction with the accompanying drawings.

DESCRIPTION

Described herein is an Optical Proximity Correction (OPC) design method for sub-wavelength contact hole mask using a novel modeling approach to predict placement of Assist Features (AF). An aerial image for a finite illumination source is useful for determining optimal positioning of assist features. Such imagery may represent the feature to be created, for example a contact hole, and area(s) of interference. Strategic placement of assist features in a mask corresponding to these interference area(s) advantageously focuses light intensity on the substrate surface corresponding to the feature to be created. It is noted that the method of the present invention is not limited to formation of contact hole patterns.

There are two primary methods for calculating the aerial image for a finite illumination source, and are disclosed in United States Patent Application Publication Number US 2002/0152452 A1, which is incorporated herein by reference. One method described therein is Hopkin's formulation. Nonetheless, both methods require extensive computations.

Figure 1:
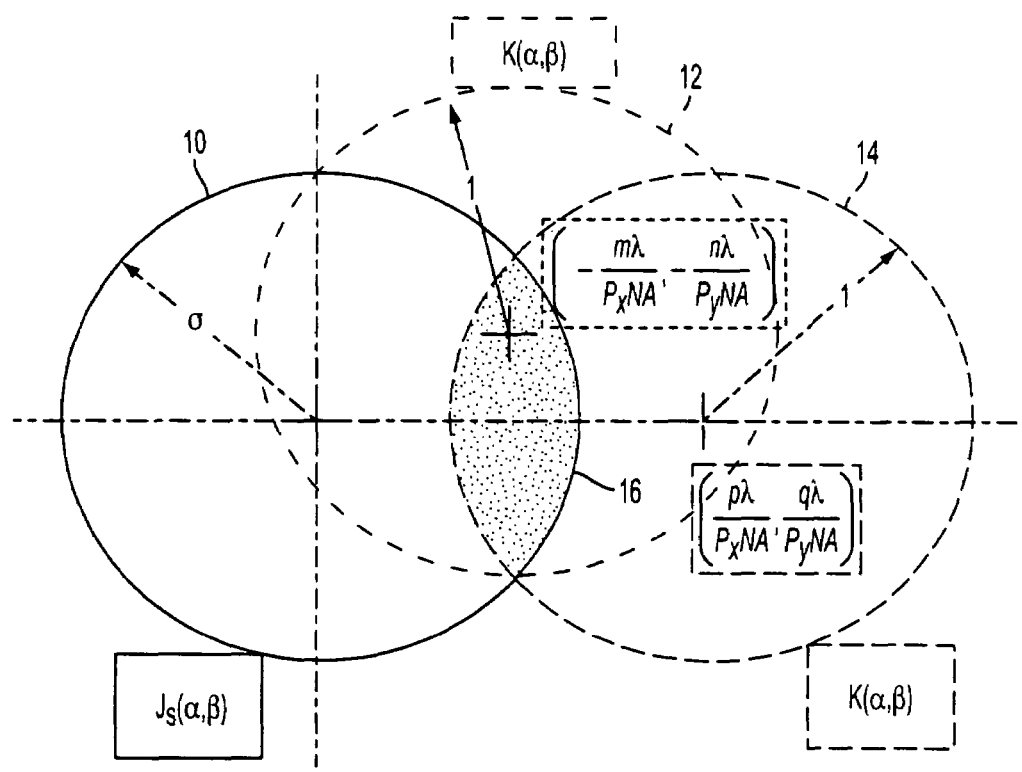
FIG. 1 is a diagram of an exemplary transmission cross coefficient (TCC) function for a generalized imaging system.

For example, Hopkin's formulation uses a four dimension transmission cross coefficient (TCC) for representing image intensity. More particularly, the TCC is mathematically represented by Equation 1, which is the autocorrelation of the illumination pupul ($J_s(\alpha,\beta)$) multiplied by the projection pupil ($K(\alpha,\beta)$). In accordance with Equation 1 and as illustrated by FIG. 1, the leftmost circle 12 represents the illumination pupil illumination pupil ($J_s(\alpha,\beta)$); the central circle 12 represents the projection pupil ($K(\alpha,\beta)$) centered at ($-m/P_xNA, -n/P_yNA$); and the rightmost circle 14 represents the projection pupil ($K(\alpha,\beta)$) centered at ($p/P_xNA$, $q/P_yNA$). The TCC is represented by the area 16 where circles 10, 12, 14 overlap.

$$TCC(m, n, p, q) = \int\int_{\sqrt{\alpha^2+\beta^2}<\sigma} J_s(\alpha,\beta) K\left(\alpha + \frac{m\lambda}{P_xNA}, \beta + \frac{n\lambda}{P_yNA}\right) \quad \text{Eqn. 1}$$

$$K^*\left(\alpha - \frac{p\lambda}{P_xNA}, \beta - \frac{q\lambda}{P_yNA}\right)$$

In Equation 1, m, n, p and q correspond to discrete diffraction orders, i.e., the TCC is a four dimensional function. Diffraction orders in the x-direction are represented by m and p, and the diffraction order in the y-direction are represented by n and q.

In accordance with novel concepts disclosed, Equation 1 can be broken down into a set of two 2-D functions by using a well known mathematical operation known as Singular Value Decomposition (SVD), which involves diagnolizing a 4-D matrix. From the TCC, a matrix of Eigenvectors $\Phi(m,n)$, $\Phi(p,q)$ multiplied by scalars, Eigenvalues $\lambda_b$, is formed. Accordingly, each eigenvalue $\lambda_b$ is paired with a corresponding so-called right eigenvector $\Phi(m,n)$ and a corresponding left eigenvector $\Phi(p,q)$, as shown by Equation 2.

$$TCC(m, n, p, q) = \sum_b \lambda_b \Phi_b(m, n) \Phi_b^*(p, q) \quad \text{Eqn. 2}$$

Figure 2:
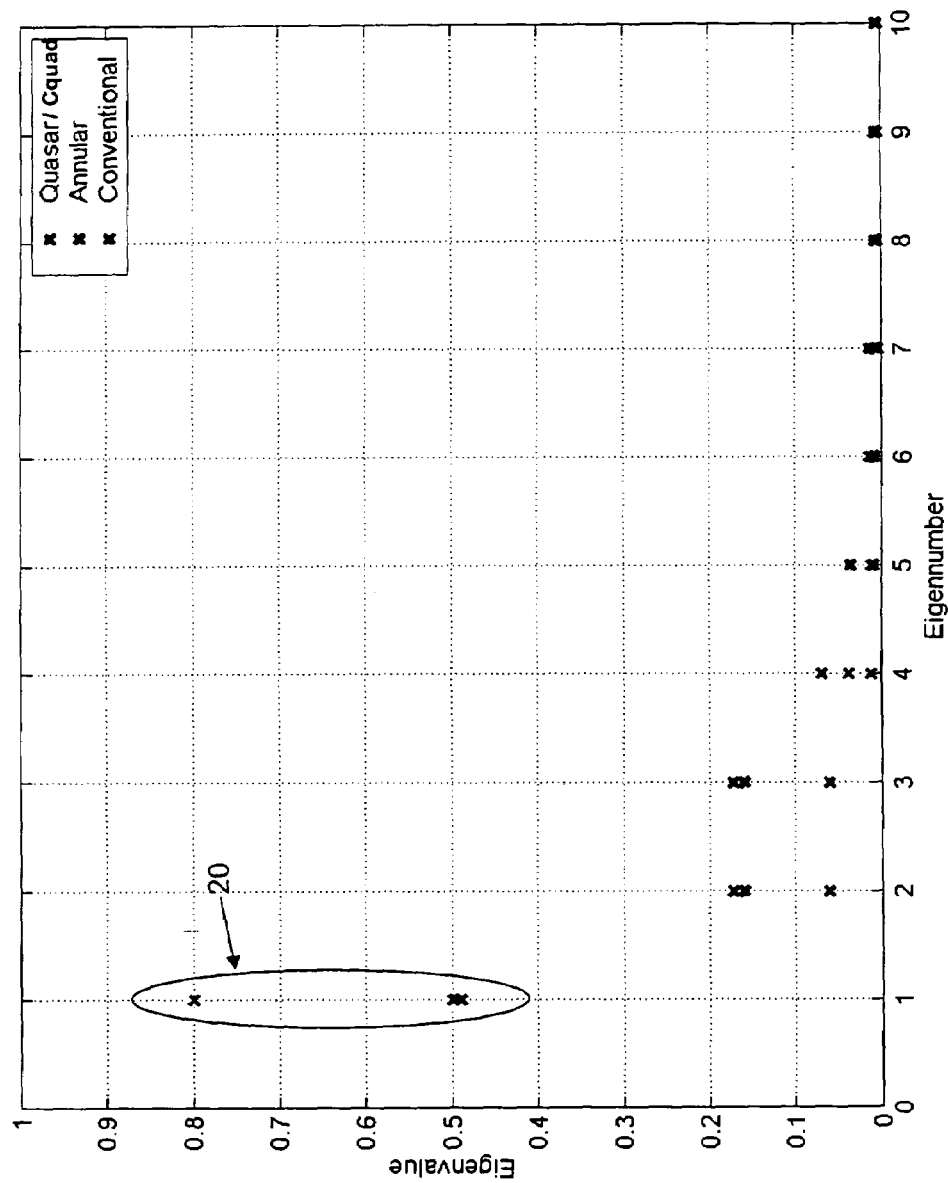
FIG. 2 is a plot of Eigenvalues after diagonalizing the TCC with singular value decomposition for different types of illuminations.
Figure 3:
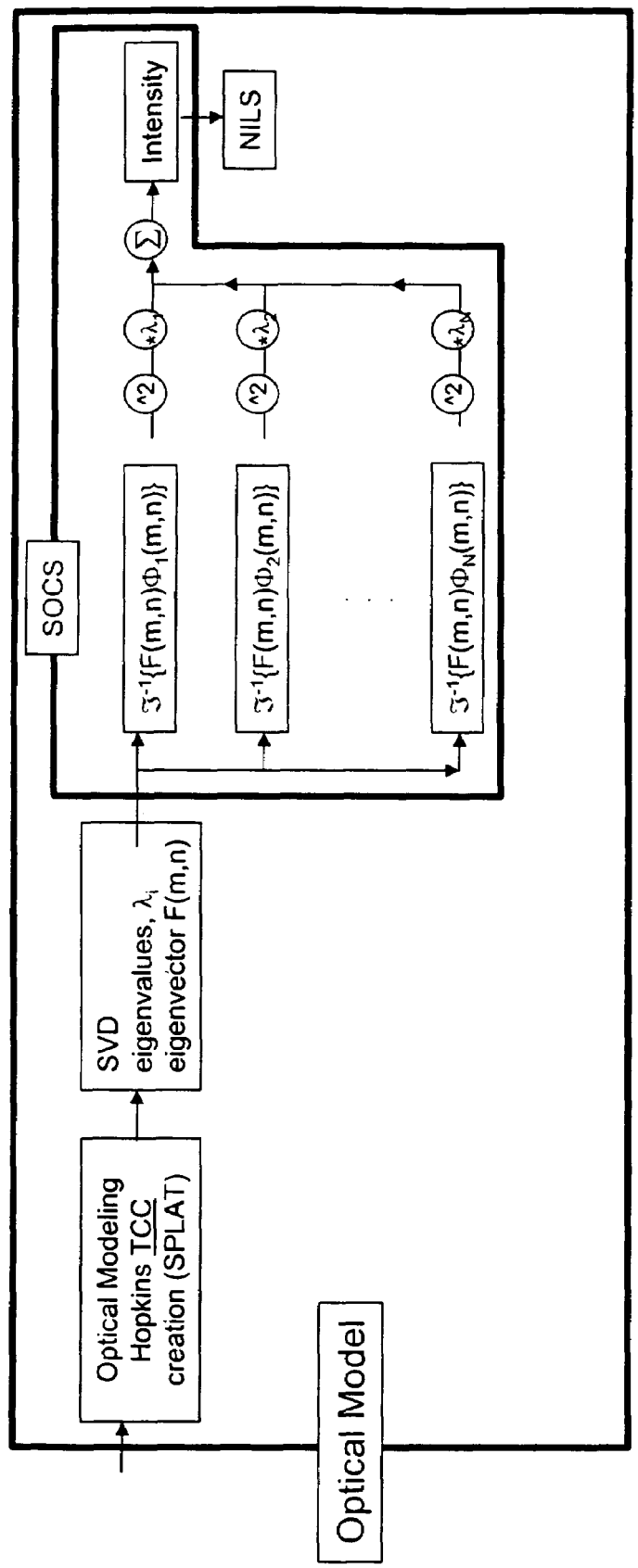
FIG. 3 is a representation of the sum of coherent sums.
Figure 4A:
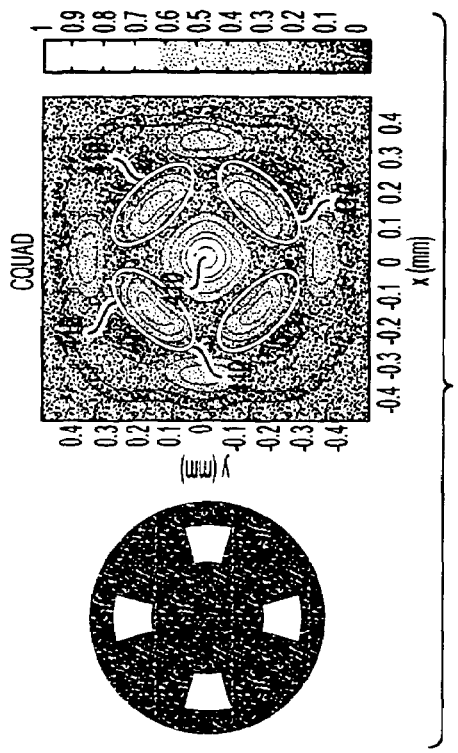
FIG. 4(a)-(d) is a pictorial representation of the illumination of the First TCC Eigenfunction for Quasar, Cquad, Annular and Conventional illuminators, respectively.
Figure 4B:
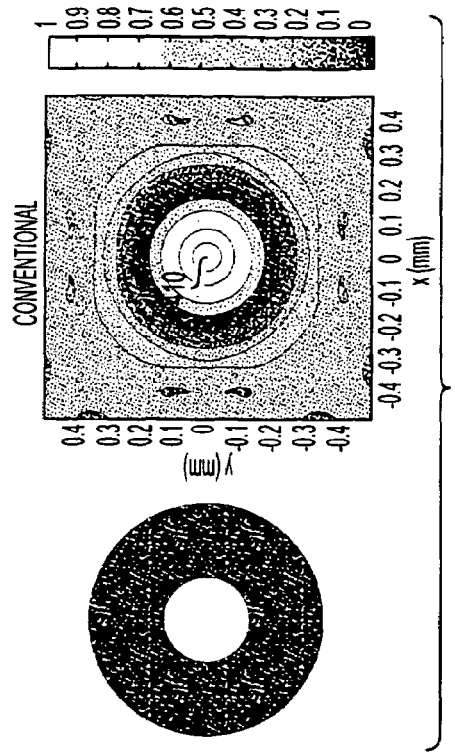
Figure 4C:
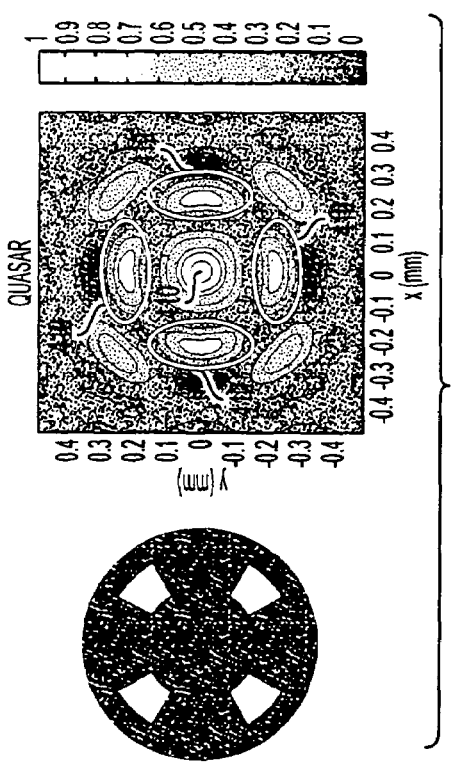
Figure 4D:
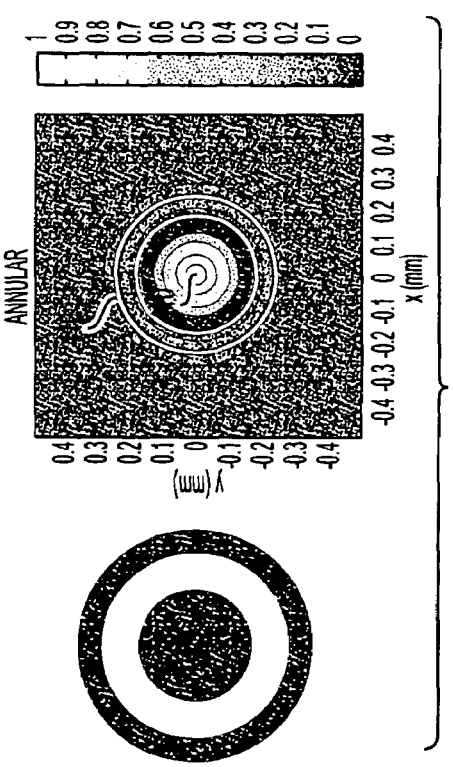

FIG. 2 illustrates a plot of a matrix of Eigenvalues, $\lambda_b$, corresponding to Quasar, Annular, and Conventional illuminations. Because illuminators have a finite radius, comparative to an ideal illuminator having an infinitely small radii poles, more than one eigenvalue results. However, the plot of FIG. 2 also illustrates how the eigenvalues for each illuminator decay at a rapid rate. In order to reduce the complexity of Equation 2 and subsequent calculations, the first eigenvalue 20 may be substituted for a good approximation of TCC. However, more than one eigenvalue can be used for greater accuracy. The Sum of Coherent Sums (SOCS) operation may be used to compute the aerial image when taking into account multiple Eigenvalues, $\lambda_b$, and is illustrated by the flowchart of FIG. 3.

FIGS. 4(*a*)-(*d*) pictorially illustrate plots of the TCC for Quasar, Cquad, Annular and Conventional illuminations, respectively, taking into account only the first eigenvalue $\lambda_1$. Using conventional illumination (FIG. 4(*d*)), there is significant interference outside of the contact hole 410. However, in comparison in FIGS. 4(*a*)-(*c*), light is primarily focused on the contact hole 410, but distinct areas 412 of interference appear outside of the contact hole 410. Depending on the illuminator used, these areas of interference (also referred to as "side lobes") take different shapes and positions with respect to the contact hole 410. These areas of interference correspond to so-called areas of possible constructive interference for a dark field mask, i.e., they positively interfere with the light intensity representing the feature to be created. In FIG. 4(*a*), side lobes 412 are formed horizontally and vertically with respect to the contact hole 410. In FIG. 4(*b*), side lobes 412 are formed diagonally with respect to the contact hole 410. In FIG. 4(*c*), side lobe 412 forms a donut shape circling the contact hole 410. In order to increase the positive affects of interference side lobes, assist features would be placed in a mask corresponding to each side lobe in order to focus light intensity on the contact hole 410.

Figure 5:
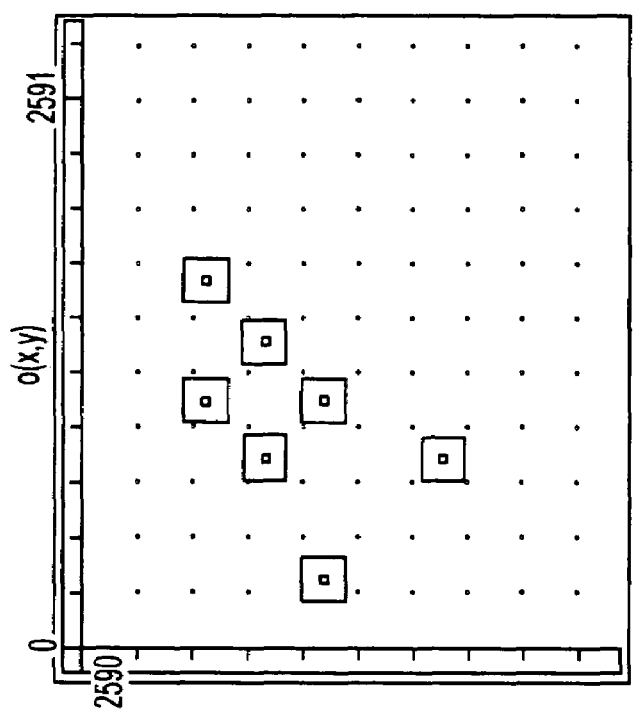
FIG. 5 is a pictorial representation of Equation 1 in which contact holes of a pattern to be created are replaced with impulse delta functions.

In order to generate an aerial image of a resolvable feature to be formed in a substrate, such as a contact hole, Equation 2 must be associated with the contact hole and corresponding illuminator. An impulse delta function may be used to represent a contact hole, also represented by Equation 3 and illustrated by FIG. 5.

$$o(x, y) = \sum_{a=1}^{N} \delta(x - x_a, y - y_a) \quad \text{Eqn. 3}$$

In order to determine the interference caused by a contact hole pattern using any of the illuminations of FIGS. 4(*a*)-(*d*) for example, the inverse Fourier transform of eigenvetor $\Phi(m,n)$ can be convolved with the impulse delta function representing the contact hole pattern, as represented by Equation 4.

$$g(x,y) = FT^{-1}\{\Phi(m,n)\} \otimes o(x,y) \quad \text{Eqn. 4}$$

However, calculations of Equation 4 may be simplified by first converting the impulse delta function $o(x,y)$ to the frequency domain by performing a Fourier transform, as represented by Equation 5. Equation 6 represents the resulting expression in the frequency domain.

$$O(m, n) = \sum_{a=1}^{N} e^{-im\frac{x_a}{P_x}} e^{-in\frac{y_a}{P_y}} \quad \text{Eqn. 5}$$

$$G(m, n) = O(m, n)\Phi_1(m, n)$$

In order to determine an aerial image, the inverse Fourier transform must Eqn. 6 Equation 6, shown by Equation 7. Equation 7 represents an aerial image, also pictorially illustrated by FIG. 6.

$$g(x, y) = FT^{-1}\{G(m, n)\} = \sum_{m=1}^{M}\sum_{n=1}^{N} G(m, n) e^{im\frac{x}{P_x}} e^{in\frac{y}{P_y}} \quad \text{Eqn. 7}$$

Figure 8:
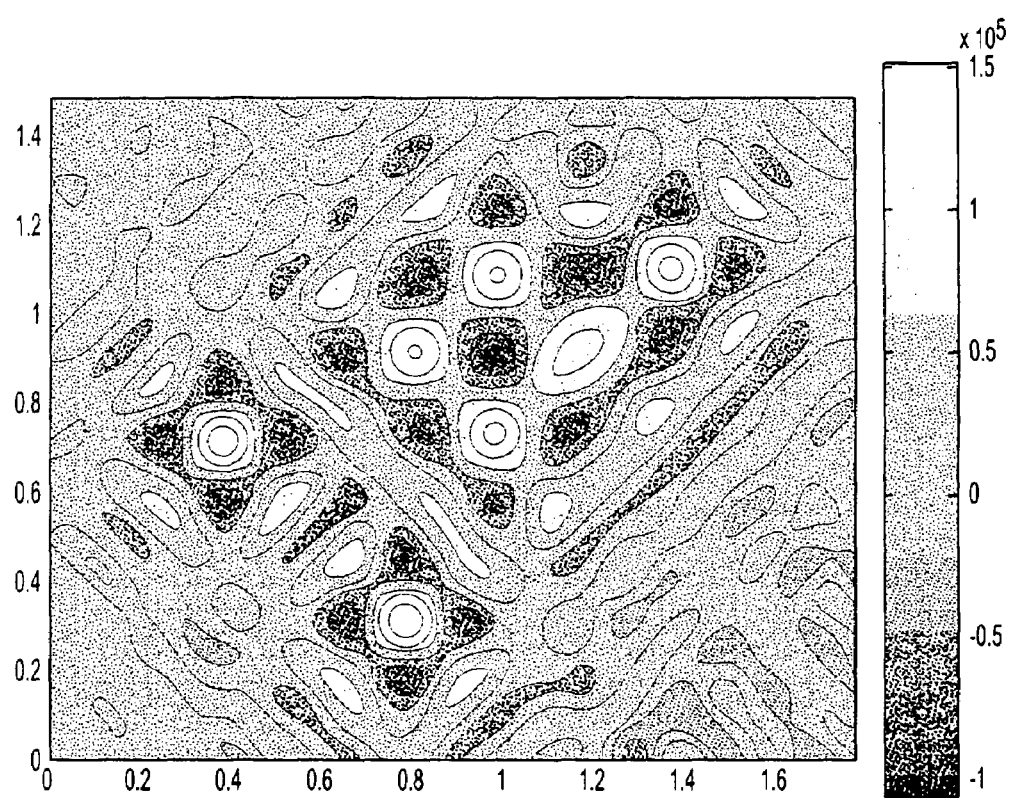
FIG. 8 an illumination corresponding to the second derivative of the interenfernce function.

Different types of aerial images may be used for optimal assist feature placement. For example, taking the second derivative of Equation 6, as represented by Equation 8, and the inverse Fourier transform, as represented by Equation 9, creates an aerial image illustrating the degree of change (i.e. slope) of intesity levels, as in FIG. 8 for example. An aerial image illustrating a degree of change helps assist feature placement.

$$F(m, n) = O(m, n)\Phi_1(m, n)\left(\frac{m}{P_x}\right)^2 \left(\frac{n}{P_y}\right)^2 \quad \text{Eqn. 8}$$

$$f(x, y) = FT^{-1}\{F(m, n)\} = \sum_{m=1}^{M}\sum_{n=1}^{N} F(m, n) e^{im\frac{x}{P_x}} e^{in\frac{y}{P_y}} \quad \text{Eqn. 9}$$

A Chromeless Phase Lithography (CPL) Contact Mask, High Percentage Transmission Attenuated Phase Shift Mask (PSM), and other types of PSM have three possible transmission conditions $A_a$ of 0 (no light transmits through the reticle), +1 (100% transmission, no phase shift), and −1 (100% transmission, 180 degree phase shift), which should be taken into account when generating an aerial image. To account for the feature transmission level, Equation 3 may be modified by adding variable $A_a$ for the transmission condition.

$$o_{CPL}(x, y) = \sum_{a=1}^{N} A_a \delta(x - x_a, y - y_a)$$ Eqn. 10

Accordingly, the aerial image, represented by Equation 11, is determined by convoluting the inverse Fourier transform of the Eigenvector Φ(m,n) with the impulse function $O_{CPL}$(X, Y) of Equation 10.

$g(x,y) = FT^{-1}\{\Phi(m,n)\} \otimes o_{CPL}(x,y)$ Eqn. 11

Advantageously, the transmission condition $A_a$ at each contact hole may be determined by maximizing the minimum peak intensity at the impulse function locations $(x_a, y_a)$, as shown in Equation 12.

$\max[\min\{g(x_a,y_a)\}]$ Eqn. 12

Figure 7:
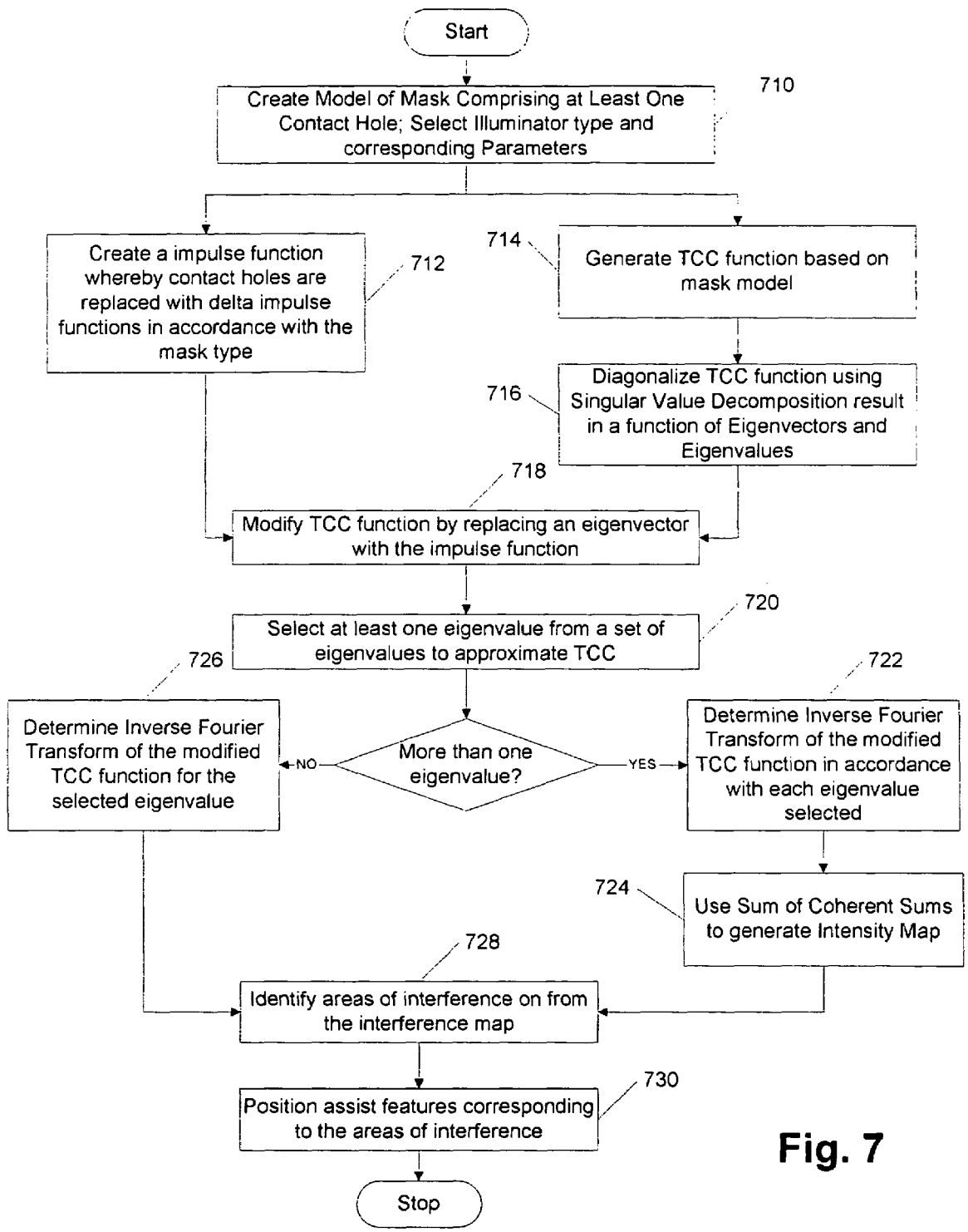
FIG. 7 illustrates a flowchart of the novel modeling method disclosed herein.

It is noted that the following discussion sets forth an example of the p ion using a dark-field mask type, however, it is noted that the novel concepts discussed herein may be used with clear field mask types. FIG. 7 is an exemplary flowchart illustrating the method of applying optical proximity correction techniques to a mask pattern in accordance with the generation of an interference map. It is also noted that the interference map can be generated using numerous methods, for example, using a conventional aerial image simulator (e.g., Lithocruiser or Mask Weaver simulation products offered by MaskTools, Inc.) as disclosed in copending application Serial No. (to be determined) or by mathematically modeling the area image as in the instant application.

The disclosed concepts may be represesented by a series of steps, as illustrated by the flow chart of FIG. 7. In step 710, a mask model is created including at least one contact hole. Also, the type of illuminator and corresponding parameters are chosen. In Step 712, an impulse function (e.g., Equation 3, Equation 10) is created whereby each contact hole of the mask is represented by an impulse delta function in accordance with the mask type (e.g., phase shifting mask, regular mask). Concurrently therewith, in Step 714, the TCC (Equation 1) is generated based on the illumination and projection lens model, and in Step 716, the complex TCC function is simplified by diagonalizing the function using SVD resulting in a function of eigenvectors and eigenvalues (Equation 2). In Step 718, the simplified TCC function is modified by replacing an eigenvector with the delta function created in Step 712 (Equations 4-6). In Step 720, at least one eigenvalue is selected for approximating TCC. If more than one value is selected, in Step 722, the inverse Fourier transform (Equation 9) is calculated for each eigenvalue selected, the results of which are summed in accordance with SOCs (see FIG. 3), as in Step 724. On the other hand, if only one eigenvalue is selected, in Step 726, the inverse Fourier transform (Equation 9) is calculated for the selected value. The results of either of Steps 724 or 726 represent an aerial image or interference map corresponding to the illumination on the substrate. In Step 728, areas of interference are identified on the interference map, and in Step 730, assist features are optimally positioned in a mask corresponding to the areas of interference.

EXAMPLE

The novel modeling method accurately and simply predicts interference patterns for determining strategic assist feature placement. Assume a mask of seven contact holes, a Cquad illuminator having a numerical aperture NA of 0.75, and a light source having a wavelength λ of 193 nm. First, the contact holes are replaced with impulse delta functions, as represented by Equation 2 and pictorially illustrated by FIG. 5.

Figure 6:
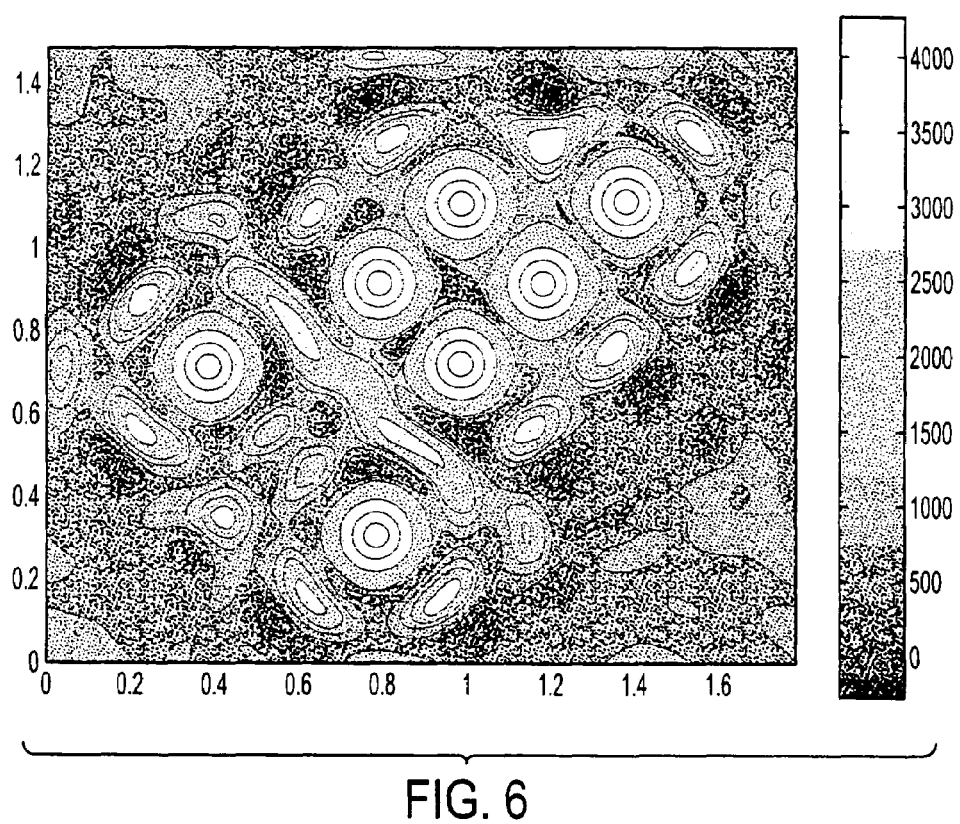
FIG. 6 is a pictorial representation of Equation 5 corresponding to the convolution of that illustrated by FIG. 4(b) and 5.

When convolved with the eigenvector Φ(m,n) for Cquad illumination, the aerial image of FIG. 6 results. There, it is shown multiple areas 60 of side lobe interference. Accordingly, assist features may be positioned corresponding to these interference areas in a mask in order to limit side lobe printing.

Figure 9:
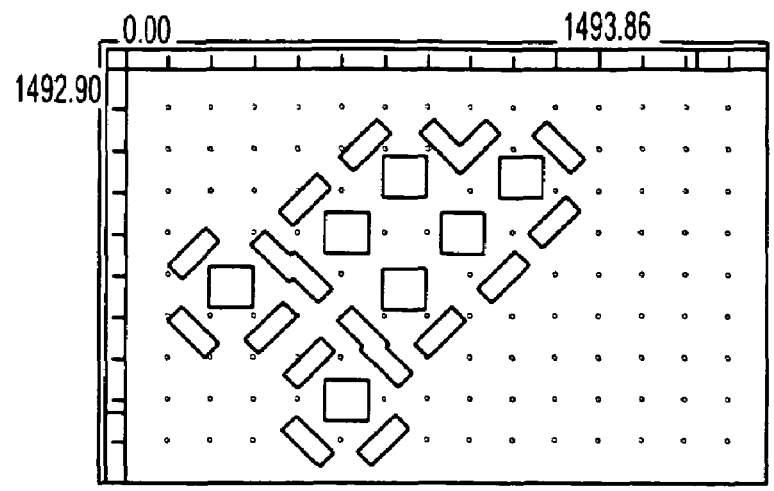
FIG. 9 illustrates optimal placement of assist features corresponding to the illumination of FIG. 6.
Figure 12:
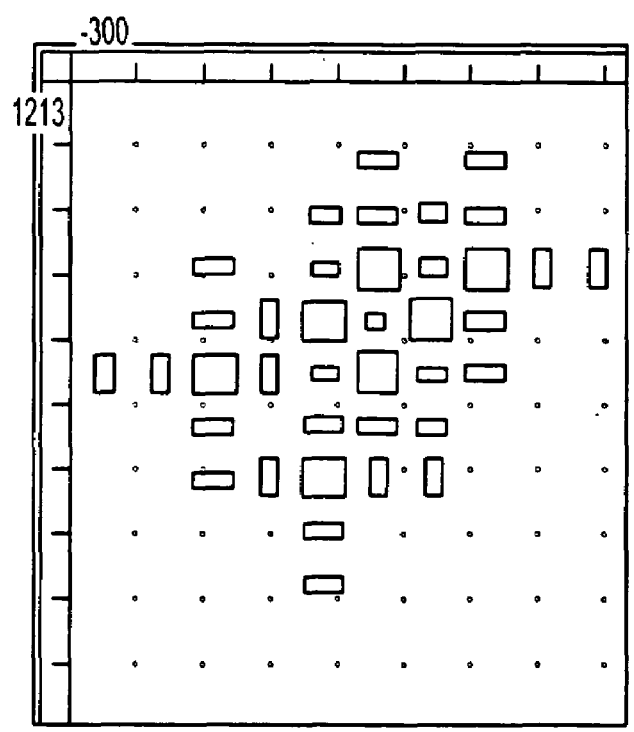
FIG. 12 illustrates assist feature placement in accordance with a predetermined set of rules.

FIG. 9 illustrates a mask created in accordance with the novel imaging method and example described herein. The mask 90 includes resolvable features 92, such as contact holes 92, and a plurality of assist features 94 positioned corresponding to the areas of interference 60 illustrated by the aerial image of FIG. 6.

Figure 10:
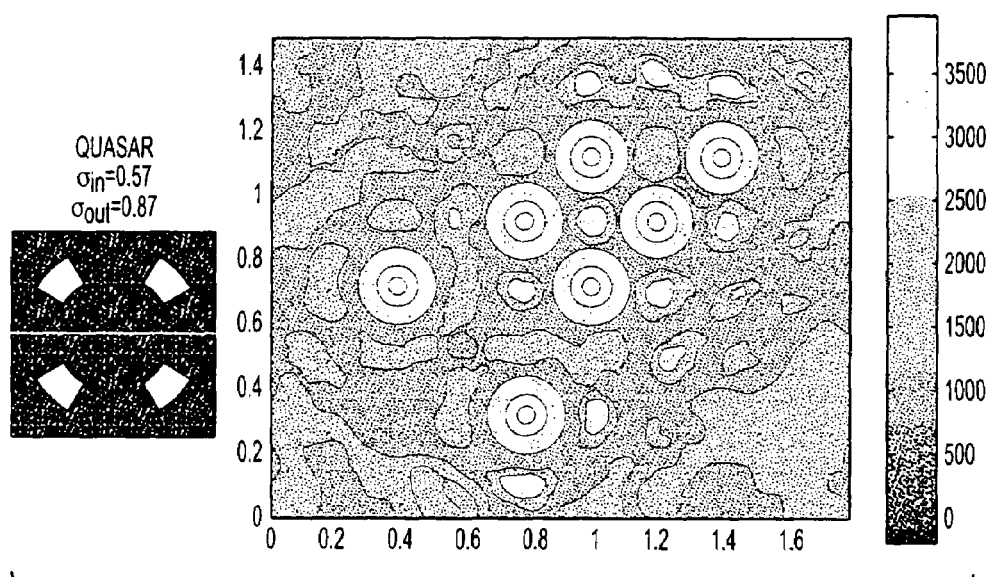
FIG. 10 illustrates a pictorial representation of Equation 5 and corresponding illumination intensity using the Quasar Illuminator of FIG. 4(a).

FIG. 10 illustrates an aerial image of the seven contact hole pattern using a Quasar illuminator. Comparison with FIGS. 6 and 9, the areas of interference differ between Cquad illumination and Quasar illumination, as would be expected. Also, Cquad illumination produces a higher light intensity as compared to Quasar illumination. Thus, using the assumed parameters, use of Cquad illumination produces superior results.

Advantages of the above-described modeling method obviates the need to timelessly test and analyze a plurality of assist feature placements for a mask design. The modeling method predicts that type of interference or side lobes that would appear in accordance with a specific illuminator. Accordingly, assist features may be optimally and strategically placed.

Figure 11:
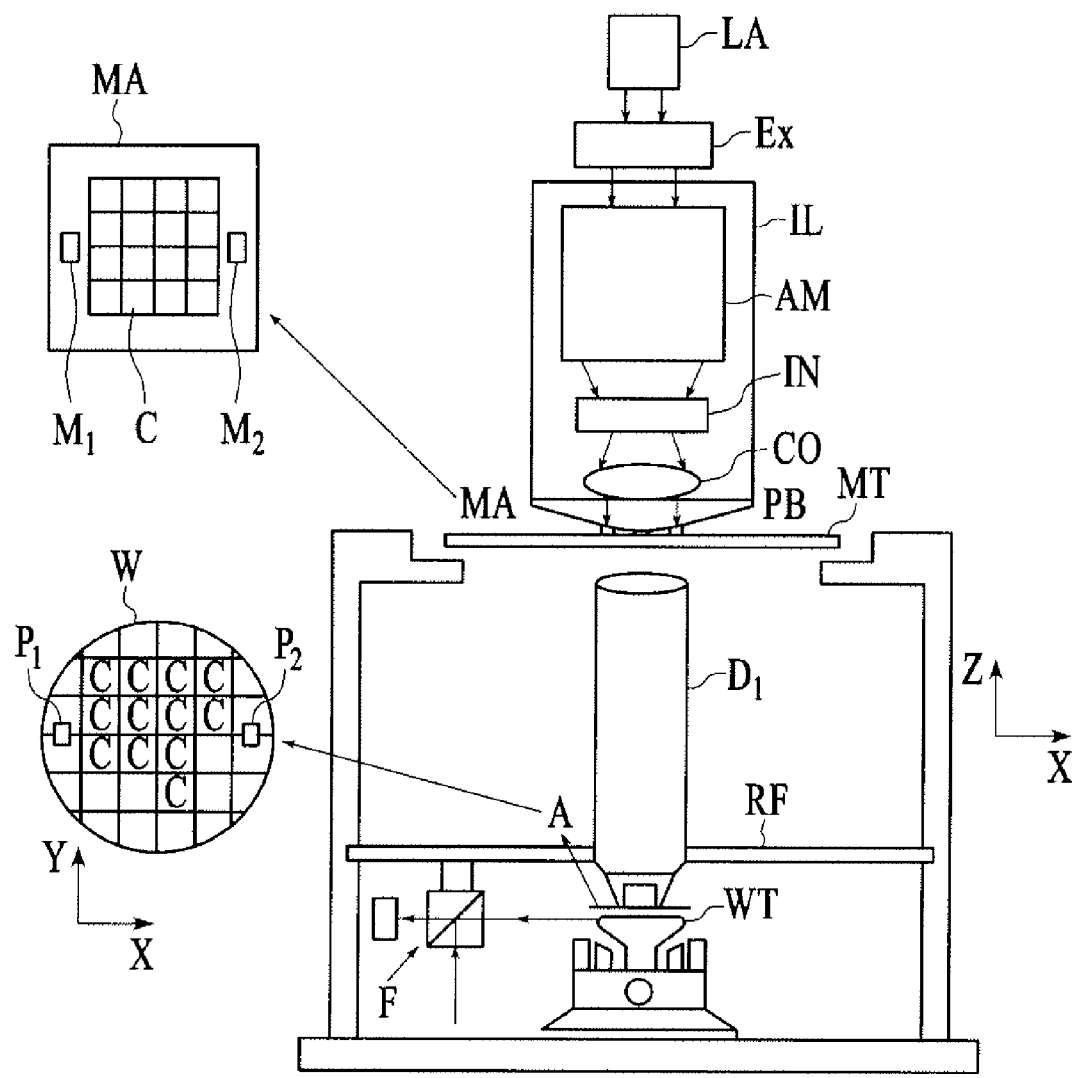
FIG. 11 schematically depicts a lithographic projection apparatus suitable for use with a mask designed with the aid of the current invention.

FIG. 11 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 11 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 11. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of a computer system involve programming, including executable code, may be used to implement the above described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of optimizing an illumination profile of a pattern to be formed in a surface of a substrate, comprising the steps of:
    defining a transmission cross coefficient ("TCC") function determined in accordance with an illumination pupil and a projection pupil corresponding to an illuminator;

representing at least one resolvable feature comprising a contiguous area of a mask by at least one impulse function at a single point of the contiguous area; and creating an interference map by processing the at least one impulse function with the TCC function, wherein the interference map represents the at least one resolvable feature to be printed on the substrate and areas of destructive optical interference near the resolvable feature on the substrate as a result of the mask being illuminated by the illuminator.

2. The method of optimizing an illumination profile according to claim 1, further comprising placing an assist feature in the mask corresponding to the areas of destructive interference.

3. The method of optimizing an illumination profile according to claim 2, wherein the assist feature is non-resolvable.

4. The method of optimizing an illumination profile according to claim 1, wherein the interference map models light intensity incident on the substrate.

5. The method of optimizing an illumination profile according to claim 4, further comprising placing at least one assist feature on an area of the mask corresponding to an area on the interference map having a light intensity of a predetermined level corresponding to the areas of destructive interference.

6. The method of optimizing an illumination profile according to claim 5, wherein the predetermined level corresponds to a resolvable light intensity.

7. The method of optimizing an illumination profile according to claim 1, wherein the interference map represents change in light intensity incident on the substrate.

8. The method of optimizing an illumination profile according to claim 1, wherein the step of identifying the TCC function includes simplifying a complex TCC function into a simplified function having a selected number of one or more eigenvalues selected.

9. The method of optimizing an illumination profile according to claim 1, wherein the step of creating the interference map includes convolving the at least impulse function using the identified TCC function.

10. A program product, comprising executable code transportable by at least one machine readable medium, wherein execution of the code by at least one programmable computer causes the at least one programmable computer to perform a sequence of steps for optimizing an illumination profile of a pattern to be formed in a surface of a substrate, comprising:

defining a transmission cross coefficient ("TCC") function determined in accordance with an illumination pupil and a projection pupil corresponding to an illuminator;

representing at least one resolvable feature comprising a contiguous area of a mask by at least one impulse function at a single point of the contiguous area; and generating an interference map by processing the at least one impulse function with the TCC function, wherein the interference map represents the at least one resolvable feature to be printed on the substrate and areas of destructive optical interference near the resolvable feature on the substrate as a result of the mask being illuminated by the illuminator.

11. The program product according to claim 10, further comprising defining assist feature placement in the mask corresponding to the areas of destructive interference represented by the interference map.

12. The program product according to claim 10, wherein the step of identifying the TCC function includes simplifying a complex TCC function into a simplified function having a selected number one or more eigenvalues, and wherein the created interference map has an order depending on a number of eigenvalues selected.

13. The program product according to claim 10, wherein the step of creating the interference map includes convolving the at least impulse function using the identified TCC function.

* * * * *